(12) United States Patent
Cheng et al.

(10) Patent No.: US 10,418,463 B2
(45) Date of Patent: Sep. 17, 2019

(54) SILICON GERMANIUM ALLOY FINS WITH REDUCED DEFECTS

(71) Applicant: INTERNATIONAL BUSINESS MACHINES CORPORATION, Armonk, NY (US)

(72) Inventors: Kangguo Cheng, Schenectady, NY (US); Hong He, Schenectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 275 days.

(21) Appl. No.: 15/445,344

(22) Filed: Feb. 28, 2017

(65) Prior Publication Data

US 2017/0170302 A1 Jun. 15, 2017

Related U.S. Application Data

(63) Continuation of application No. 14/699,491, filed on Apr. 29, 2015, now Pat. No. 9,583,626.

(51) Int. Cl.

| | |
|---|---|
| *H01L 21/02* | (2006.01) |
| *H01L 29/06* | (2006.01) |
| *H01L 21/322* | (2006.01) |
| *H01L 21/324* | (2006.01) |
| *H01L 29/66* | (2006.01) |

(Continued)

(52) U.S. Cl.
CPC .... *H01L 29/66795* (2013.01); *H01L 21/0243* (2013.01); *H01L 21/02381* (2013.01); *H01L 21/02532* (2013.01); *H01L 21/18* (2013.01); *H01L 21/322* (2013.01); *H01L 21/324* (2013.01); *H01L 21/3221* (2013.01); *H01L 29/0649* (2013.01); *H01L 29/0653* (2013.01); *H01L 29/165* (2013.01); *H01L 29/6653* (2013.01); *H01L 29/66545* (2013.01); *H01L 29/7851* (2013.01); *H01L 29/7853* (2013.01)

(58) Field of Classification Search
CPC .................... H01L 21/823431; H01L 29/7851
See application file for complete search history.

(56) References Cited

U.S. PATENT DOCUMENTS

| | | |
|---|---|---|
| 6,800,910 B2 | 10/2004 | Lin et al. |
| 8,169,027 B2 | 5/2012 | Doyle et al. |

(Continued)

OTHER PUBLICATIONS

List of IBM Patents or Patent Applications Treated as Related dated Feb. 28, 2017 2 pages.

*Primary Examiner* — Moazzam Hossain
(74) *Attorney, Agent, or Firm* — Scully, Scott, Murphy & Presser, P.C.; Steven J. Meyers

(57) ABSTRACT

A silicon germanium alloy is formed on sidewall surfaces of a silicon fin. An oxidation process or a thermal anneal is employed to convert a portion of the silicon fin into a silicon germanium alloy fin. In some embodiments, the silicon germanium alloy fin has a wide upper portion and a narrower lower portion. In such an embodiment, the wide upper portion has a greater germanium content than the narrower lower portion. In other embodiments, the silicon germanium alloy fin has a narrow upper portion and a wider lower portion. In this embodiment, the narrow upper portion of the silicon germanium alloy fin has a greater germanium content than the wider lower portion of the silicon germanium alloy fin.

16 Claims, 12 Drawing Sheets

(51) Int. Cl.
   *H01L 29/165*  (2006.01)
   *H01L 29/78*   (2006.01)
   *H01L 21/18*   (2006.01)

(56) References Cited

U.S. PATENT DOCUMENTS

| | | | |
|---|---|---|---|
| 8,373,217 | B2 | 2/2013 | Chang |
| 8,841,178 | B1 | 9/2014 | Basker et al. |
| 2011/0278676 | A1 | 11/2011 | Cheng et al. |
| 2013/0221448 | A1* | 8/2013 | Chang ............... H01L 29/06 257/401 |
| 2014/0170839 | A1* | 6/2014 | Brunco ............ H01L 29/66795 438/479 |
| 2014/0252428 | A1* | 9/2014 | Chang ............... H01L 29/785 257/288 |
| 2014/0264608 | A1* | 9/2014 | van Dal ........... H01L 29/66795 257/365 |
| 2014/0361336 | A1* | 12/2014 | Chen ................ H01L 29/785 257/190 |
| 2015/0187571 | A1* | 7/2015 | Fan ................ H01L 29/0653 257/401 |
| 2015/0340238 | A1* | 11/2015 | Xie ................ H01L 29/0692 438/702 |
| 2016/0005868 | A1 | 1/2016 | Wei et al. |
| 2016/0111541 | A1* | 4/2016 | Chang ............. H01L 21/31144 257/288 |
| 2016/0163831 | A1* | 6/2016 | Jacob ............. H01L 29/66795 438/283 |
| 2017/0069728 | A1* | 3/2017 | Vellianitis ............ H01L 29/785 |

* cited by examiner

SILICON GERMANIUM ALLOY FINS WITH REDUCED DEFECTS

BACKGROUND

The present application relates to semiconductor structures and methods of forming the same. More particularly, the present application relates to semiconductor structures containing a silicon germanium alloy fin that has reduced defects and extends upwards from a remaining portion of a silicon substrate and methods of forming the same.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, silicon fin field effect transistors (FinFETs) is the next step in the evolution of complementary metal oxide semiconductor (CMOS) devices. Silicon fin field effect transistors (FETs) can achieve higher drive currents with increasingly smaller dimensions as compared to conventional planar FETs. In order to extend these devices for multiple technology nodes such as, for example, 10 nm and beyond, there is a need to boost the performance with high-mobility channels.

In such FinFET devices, a fin containing a silicon germanium alloy is one promising channel material because of its high-carrier mobility. Silicon germanium alloy fins can be formed by epitaxially growing a silicon germanium alloy layer on a surface of a silicon (Si) substrate and then patterning the silicon germanium alloy layer. This prior art method of forming silicon germanium alloy fins has some drawbacks associated therewith. For example, the direct epitaxial growth of a silicon germanium alloy on a Si substrate has a critical thickness limit. Above the critical thickness, silicon germanium is very defective and is not suitable for use as a device channel material. This prevents a thick silicon germanium alloy layer for high fin heights. Moreover, this approach is not scalable for silicon germanium alloy fins having a high (i.e., greater than 70 atomic %) germanium content.

Another approach is to provide silicon germanium alloy fins is to first form Si fins and shallow trench isolation (STI) structures and thereafter epitaxial grow a silicon germanium alloy fin on each sidewall surface of each Si fin. This approach overcomes the critical thickness problem mentioned above. However, silicon germanium alloy fins that are epitaxially grown on sidewall surfaces of a Si fin with the presence of dielectric oxide causes potential defect generation at the silicon germanium alloy fin/STI oxide corners.

In view of the above, there is a need for providing a method of forming silicon germanium alloy fins that avoids the drawbacks associated with prior art silicon germanium alloy fin formation.

SUMMARY

A silicon germanium alloy is formed on sidewall surfaces of a silicon fin. An oxidation process or a thermal anneal is employed to convert a portion of the silicon fin into a silicon germanium alloy fin. In some embodiments, the silicon germanium alloy fin has a wide upper portion and a narrower lower portion. In such an embodiment, the wide upper portion has a greater germanium content than the narrower lower portion. In other embodiments, the silicon germanium alloy fin has a narrow upper portion and a wider lower portion. In this embodiment, the narrow upper portion of the silicon germanium alloy fin has a greater germanium content than the wider lower portion of the silicon germanium alloy fin.

In one aspect of the present application, methods of forming semiconductor structures are provided. In accordance with one embodiment of the present application, a method is provided that includes forming a silicon germanium alloy portion on each sidewall surface of a silicon fin, the silicon fin extending upward from a remaining portion of a silicon substrate. Next, a trench isolation dielectric material is provided on exposed surfaces of the remaining portion of the silicon substrate and on exposed sidewall surfaces of each silicon germanium alloy portion and the silicon fin. A portion of the silicon fin that is located laterally adjacent each silicon germanium alloy portion is converted into a silicon germanium alloy fin. The silicon germanium alloy fin comprises a wide upper portion and a narrower lower portion. The silicon germanium alloy fin has a vertically graded germanium content in which the wide upper portion of the silicon germanium alloy fin has a greater germanium content than the narrower lower portion of the silicon germanium alloy fin. Sidewall surfaces of the narrower lower portion of the silicon germanium alloy fin are vertically coincident with sidewall surfaces of the silicon fin portion.

In another embodiment, a method is provided that includes forming a silicon germanium alloy layer on each sidewall surface of a silicon fin, the silicon fin extending upward from a silicon pedestal portion which is present on a silicon base substrate. A trench isolation dielectric material is provided on exposed surfaces of the silicon base substrate and on exposed sidewall surfaces of each silicon germanium layer and the silicon fin. A portion of the silicon fin that is located laterally adjacent each silicon germanium layer is converted into a silicon germanium alloy fin. The silicon germanium alloy fin comprises a narrow upper portion and a wider lower portion. The silicon germanium alloy fin has a vertically graded germanium content in which the narrow upper portion of the silicon germanium alloy fin has a greater germanium content than the wider lower portion of the silicon germanium alloy fin. Sidewall surfaces of the wider lower portion of the silicon germanium alloy fin are vertically coincident with sidewall surfaces of the silicon pedestal portion.

In another aspect of the present application, semiconductor structures are provided. In accordance with one embodiment of the present application, a semiconductor structure is provided that includes a silicon fin portion extending upward from a remaining portion of a silicon substrate. A silicon germanium alloy fin is located on the silicon fin portion and comprises a wide upper portion and a narrower lower portion. The silicon germanium alloy fin has a vertically graded germanium content in which the wide upper portion of the silicon germanium alloy fin has a greater germanium content than the narrower lower portion of the silicon germanium alloy fin and sidewall surfaces of the narrower lower portion of the silicon germanium alloy fin are vertically coincident with sidewall surfaces of the silicon fin portion.

In accordance with another embodiment of the present application, a semiconductor structure is provided that includes a silicon pedestal portion extending upward from a silicon base substrate. A silicon germanium alloy fin is located on the silicon pedestal portion and comprises a narrow upper portion and a wider lower portion. The silicon germanium alloy fin has a vertically graded germanium content in which the narrow upper portion of the silicon germanium alloy fin has a greater germanium content than the wider lower portion of the silicon germanium alloy fin. The sidewall surfaces of the wider lower portion of the silicon germanium alloy fin are vertically coincident with sidewall surfaces of the silicon pedestal portion.

DETAILED DESCRIPTION

Figures 1, 2:
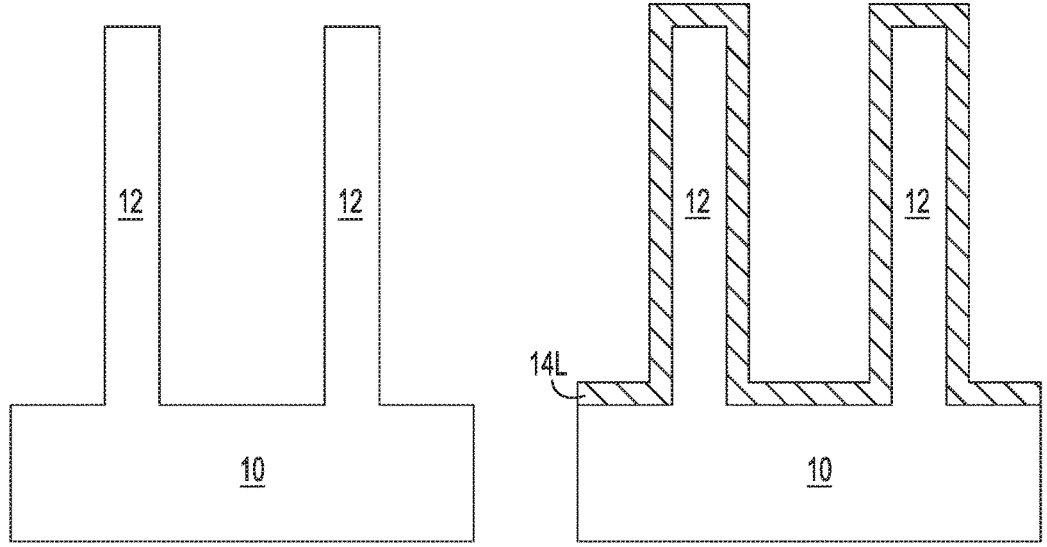
FIG. 1 is a cross sectional view of an exemplary semiconductor structure including a plurality of silicon fins extending upwards from a surface of a remaining portion of a silicon substrate in accordance with a first embodiment of the present application.
FIG. 2 is a cross sectional view of the exemplary semiconductor structure of FIG. 1 after forming a silicon germanium alloy layer on all exposed surfaces of each silicon fin of the plurality of silicon fins and the remaining portion of the silicon substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including a plurality of silicon fins 12 extending upwards from a surface of a remaining portion of a silicon substrate 10 in accordance with a first embodiment of the present application. Although a plurality of silicon fins 12 are shown, the present application can be employed only when a single silicon fin 12 is formed.

Each silicon fin 12 can be formed by first providing a silicon substrate 10. The silicon substrate 10 that can be used in the present application comprise an uppermost portion of a bulk silicon substrate or a topmost silicon layer of a semiconductor-on-insulator substrate. The silicon substrate 10 that is employed in the present application is typically single crystalline silicon. In one embodiment, the silicon substrate 10 is non-doped (i.e., an intrinsic semiconductor material).

Each silicon fin 12 can be formed by patterning a portion of the silicon substrate 10. In one embodiment, the patterning process used to define each silicon fin 12 comprises a sidewall image transfer (SIT) process. The SIT process includes forming a contiguous mandrel material layer (not shown) on the topmost surface of the silicon substrate 10. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. Since the dielectric spacers are used in the SIT process as an etch mask, the width of the each dielectric spacer determines the width of each silicon fin 12.

After formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers partially into the silicon substrate 10. The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process used to define each silicon fin 12 can include lithography and etching. Lithography includes forming a photoresist material (not shown) on the topmost surface of the silicon substrate 10. The photoresist material can be formed utilizing a deposition process such as, for example, spin-on coating, evaporation, or chemical vapor deposition. Following the deposition of the photoresist material, the photoresist material is exposed to a pattern of irradiation, and thereafter the exposed resist material is developed utilizing a conventional resist developer to provide a patterned photoresist material. At least one etch as mentioned above for the SIT process can be used here to complete the pattern transfer. Following at least one pattern transfer etch process, the patterned photoresist material can be removed from the structure utilizing a conventional resist stripping process such as, for example, ashing.

As used herein, a "fin" refers to a contiguous semiconductor material, in the present case silicon, and including a pair of vertical sidewalls that are parallel to each other. As used herein, a surface is "vertical" if there exists a vertical plane from which the surface does not deviate by more than three times the root mean square roughness of the surface. In one embodiment of the present application, each silicon fin 12 has a height from 10 nm to 200 nm and a width from 4 nm to 30 nm. Other heights and widths that are lesser than, or greater than the ranges mentioned herein can also be used in the present application. Each silicon fin 12 is spaced apart from its nearest neighboring silicon fin 12 by a pitch of from 20 nm to 100 nm. Also, each silicon fin 12 is oriented parallel to each other. Furthermore, no material interface exists between each silicon fin 12 that is formed and the remaining portion of the silicon substrate 10.

Referring now to FIG. 2, there is illustrated the exemplary semiconductor structure of FIG. 1 after forming a silicon germanium alloy layer 14L on all exposed surfaces of each silicon fin 12 of the plurality of silicon fins and the remaining portion of the silicon substrate 10. In this embodiment of the present application, the silicon germanium alloy layer 14L is a contiguous layer that is formed on all exposed silicon surfaces including all exposed surfaces of each Si fin 12 and the remaining portion of silicon substrate 10.

The silicon germanium alloy layer 14L is formed by an epitaxial growth (or epitaxial deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application, the silicon germanium alloy layer 14L has an epitaxial relationship, i.e., same crystal orientation, as that of the Si fin 12 and the remaining portion of semiconductor substrate 10.

Examples of various epitaxial growth processes that are suitable for use in forming the silicon germanium alloy layer 14L include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking.

A number of different source gases may be used for the deposition of silicon germanium alloy layer 14L. In some embodiments, the source gas for the deposition of the silicon germanium alloy layer 14L includes a mixture of a silicon containing gas source and a germanium containing gas source or a combined silicon and germanium source gas may be used. Carrier gases like hydrogen, nitrogen, helium and argon can be used.

The thickness of the silicon germanium alloy layer 14L that can be formed is from 2 nm to 20 nm. Other thicknesses that are lesser than, or greater than, the aforementioned thickness range can also be employed in the present application. The silicon germanium alloy layer 14L that is formed can have a germanium content of from 20 atomic % to 80 atomic % germanium. Other germanium contents that are lesser than, or greater than the aforementioned range may also be used in the present application.

Figure 3:
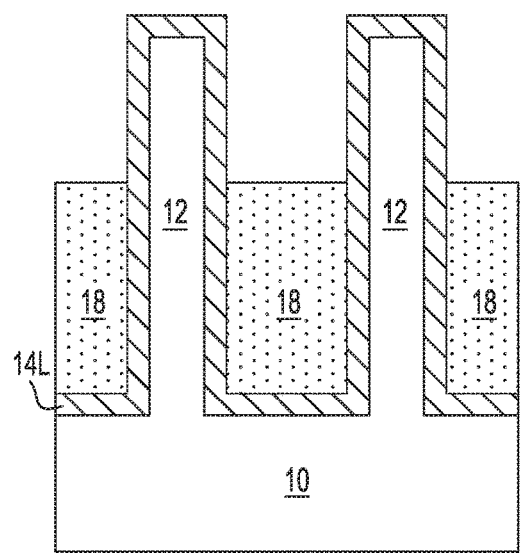
FIG. 3 is a cross sectional view of the exemplary semiconductor structure of FIG. 2 after forming a sacrificial dielectric structure within each gap that is located between each silicon fin of the plurality of silicon fins.

Referring now to FIG. 3, there is illustrated the exemplary semiconductor structure of FIG. 2 after forming a sacrificial dielectric structure 18 within each gap that is located between each silicon fin 12 of the plurality of silicon fins. As is shown, the sacrificial dielectric structure 18 has a height that is less than the height of each silicon fin 12. The sacrificial dielectric structure 18 can be formed by first depositing an oxide material that can fill the gaps (i.e., a gap filling oxide material) between each silicon fin 12. In one embodiment, the sacrificial dielectric structure 18 comprises an oxide that can be derived from TEOS (tetraethylorthosilicate). In another embodiment, the sacrificial dielectric structure 18 may comprise a flowable oxide such as, for example, silicon oxide containing hydrogen and carbon. The deposition of the oxide material (i.e., gap filling oxide material) may include for example, CVD or PECVD. In some embodiments and in which the gap filling oxide material overfills each gap, a recess etch may follow the deposition of the gap filling oxide material. In some embodiments, no recess etch follows the deposition of the gap filling oxide. Instead, the deposition step only partially fills each gap with the gap filling oxide material.

Figure 4:
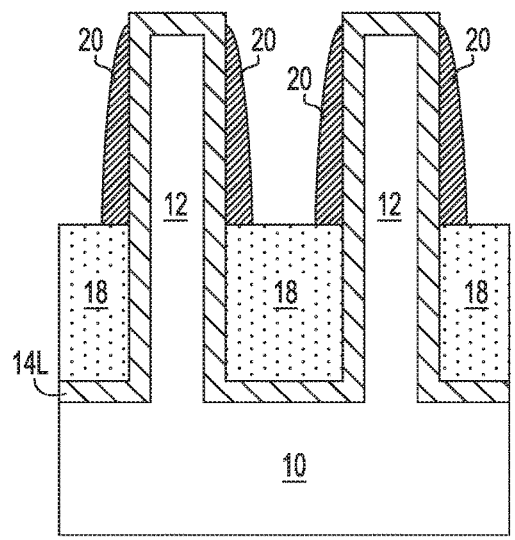
FIG. 4 is a cross sectional view of the exemplary semiconductor structure of FIG. 3 after forming a sacrificial spacer on an exposed outer sidewall surface of the silicon germanium alloy layer that is located on each sidewall surface of each silicon fin and on a portion of each sacrificial dielectric structure.

Referring now to FIG. 4, there is illustrated the exemplary semiconductor structure of FIG. 3 after forming a sacrificial spacer 20 on an exposed outer sidewall surface of the silicon germanium alloy layer 14L that is located on each sidewall surface of each silicon fin 12 and on a portion of each sacrificial dielectric structure 18. In accordance with the present application, each sacrificial spacer 20 that is provided comprises a different material than the oxide material used in providing the sacrificial dielectric structure 18 and, as such, each sacrificial spacer 20 has a different etch rate than each sacrificial dielectric structure 20. In one embodiment of the present application, each sacrificial spacer 20 comprises a dielectric nitride compound such as, for example, silicon nitride. In yet another embodiment, each sacrificial spacer 20 comprises a dielectric oxynitride compound such as, for example, silicon oxynitride. Each sacrificial spacer 20 can be formed by first depositing the material that provides the sacrificial spacer 20. Illustrative examples of deposition processes that may be used to provide each sacrificial spacer 20 include chemical vapor deposition (CVD), plasma enhanced chemical vapor deposition (PECVD) or physical vapor deposition (PVD). Following the deposition of the material that provides each sacrificial spacer 20, the deposited material is subjected to a spacer etch such as, for example, reactive ion etching.

Figure 5:
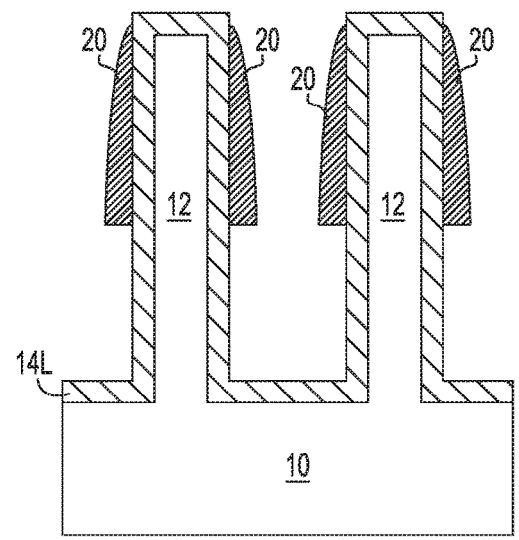
FIG. 5 is a cross sectional view of the exemplary semiconductor structure of FIG. 4 after removing each sacrificial dielectric structure.

Referring now to FIG. 5, there is illustrated the exemplary semiconductor structure of FIG. 4 after removing each sacrificial dielectric structure 18. Each sacrificial dielectric structure 18 is removed utilizing an etching process that selectively removes the gap filling oxide material relative to that of the material that provides the sacrificial spacers 20 and the silicon germanium alloy layer 14L. In one embodiment, HF can be used to selectively remove each sacrificial dielectric structure 18. As illustrated, the sacrificial spacers 20 remain and protect portions of the silicon germanium alloy layer 14L that are located laterally adjacent an upper portion of each silicon fin 12.

Figure 6:
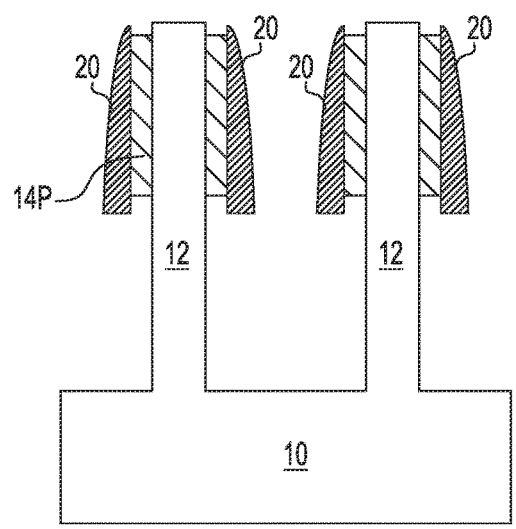
FIG. 6 is a cross sectional view of the exemplary semiconductor structure of FIG. 5 after removing exposed portions of the silicon germanium alloy layer not protected by one of the sacrificial spacers to provide a silicon germanium alloy portion on each sidewall surface of each silicon fin.

Referring now to FIG. 6, there is illustrated the exemplary semiconductor structure of FIG. 5 after removing exposed portions of the silicon germanium alloy layer 14L not protected by one of the sacrificial spacers 20 to provide a silicon germanium alloy portion 14P on each sidewall surface of each silicon fin 12. In this embodiment, the sacrificial spacers 20 serves as an etch mask. The removal of the exposed portions of the silicon germanium alloy layer 14L comprises an isotropic etch that is selective in removing a silicon germanium alloy relative to the material of the sacrificial spacer and silicon. In one example, a $H_2O_2$ etch may be used to remove the exposed portions of the of the silicon germanium alloy layer 14L. This step exposes each sacrificial spacer 20, a lower portion of each silicon fin 12, a topmost surface of each silicon fin 12 and a topmost surface of the remaining portion of silicon substrate 10.

As is shown in the drawings, each remaining silicon germanium alloy portion 14P has a topmost surface that is vertically offset and located beneath a topmost surface of each silicon fin 12 and a topmost surface of each sacrificial spacer 20. Also, each remaining silicon germanium alloy portion 14P has a bottommost surface that is vertically offset and located above a bottommost surface of each sacrificial spacer.

Figure 7:
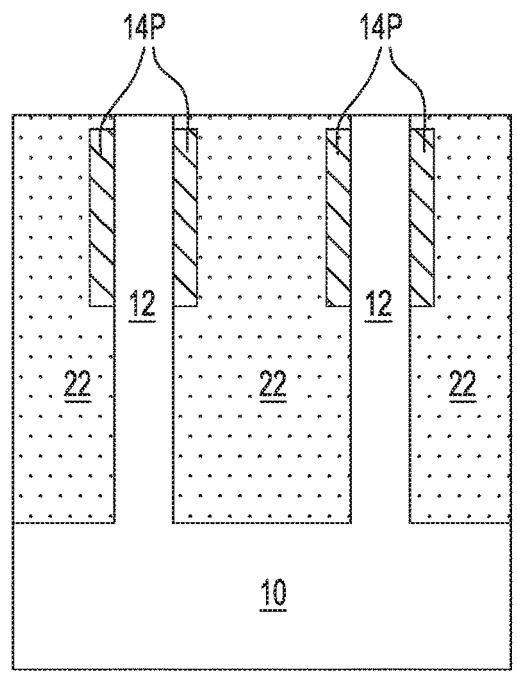
FIG. 7 is a cross sectional view of the exemplary semiconductor structure of FIG. 6 after removing each sacrificial spacer and forming a trench isolation dielectric material having a topmost surface that is coplanar with a topmost surface of each silicon fin.

Referring now to FIG. 7, there is illustrated the exemplary semiconductor structure of FIG. 6 after removing each sacrificial spacer 20 and forming a trench isolation dielectric material 22 having a topmost surface that is coplanar with a topmost surface of each silicon fin 12. Each sacrificial spacer 20 can be removed utilizing an etching process that selectively removes the sacrificial material that provides each sacrificial spacer relative to the silicon germanium alloy portion 14P, silicon fin 12 and the remaining portion of the silicon substrate 10. In one embodiment of the present application, and when the sacrificial spacers 20 comprise silicon nitride, phosphoric acid can be used as an etchant.

The trench isolation dielectric material 22 comprises any trench dielectric material including, for example, silicon dioxide. The trench isolation dielectric material 22 can be formed utilizing any deposition process including for example, chemical vapor deposition or plasma enhanced chemical vapor deposition. After depositing the trench dielectric material, a planarization process such as, for example, chemical mechanical planarization (CMP) and/or grinding, may be used. As is shown, the trench isolation dielectric material 22 has a topmost surface that is coplanar with a topmost surface of each silicon fin 12. As is also shown, the trench isolation dielectric material 22 completely fills the gaps that are located between each silicon fin 12.

Figure 8:
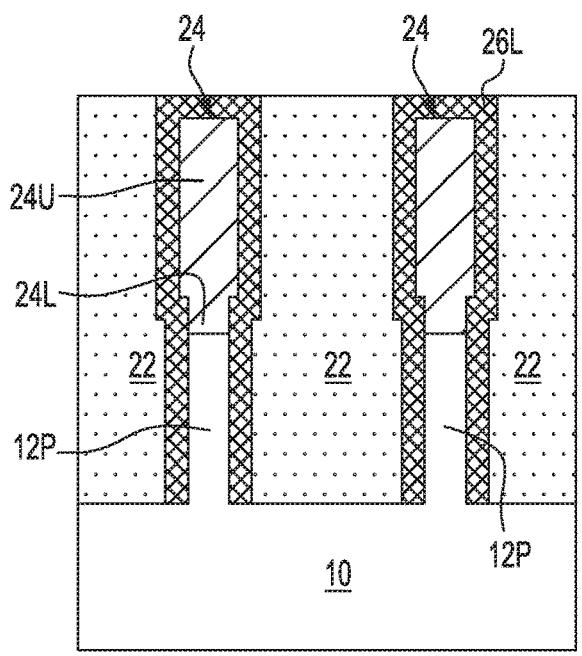
FIG. 8 is a cross sectional view of the exemplary semiconductor structure of FIG. 7 after converting a portion of the silicon fin that is located laterally adjacent each silicon germanium alloy portion into a silicon germanium alloy fin having a wide upper portion and a narrower lower portion.

Referring now to FIG. 8, there is illustrated the exemplary semiconductor structure of FIG. 7 after converting a portion of the silicon fin 12 that is located laterally adjacent each silicon germanium alloy portion 14P into a silicon germanium alloy fin 24 having a wide upper portion 24U and a narrower lower portion 24L. In some embodiments of the present application (as is shown) and when an oxidation process is used to convert a portion of the silicon fin 12 that is located laterally adjacent each silicon germanium alloy portion 14P into a silicon germanium alloy fin 24, a silicon oxide layer 26L is formed surrounding each silicon germanium alloy fin 24 and the remaining portion of each silicon fin 12. The silicon oxide layer 26L is located between the trench isolation dielectric material 22 and the fin stack of, from bottom to top, a remaining portion of silicon fin 12 (hereinafter silicon fin portion 12P) and silicon germanium alloy fin 24. The silicon fin portion 12P serves as a fin base for the silicon germanium alloy fin 24. Each silicon germanium alloy portion 14P is typically consumed during this step of the present application. In some embodiments (not depicted), it is possible that some portion of each silicon germanium alloy portion 14P may remain within the structure.

In one embodiment of the present application, and as mentioned above, an oxidation (i.e., thermal condensation) process is used to provide the exemplary semiconductor structure shown in FIG. 8. During the oxidation process, Si atoms in the each silicon germanium alloy portion 14P reacts with oxygen forming the silicon oxide layer 26L and Ge atoms from each silicon germanium alloy portion 14P diffuse laterally into a portion of each silicon fin 12 and react with Si to form the silicon germanium alloy fin 24; the trench isolation dielectric material 22 serves as a Ge diffusion cap. The oxidation process can be performed by an oxidizing ambient such as, for example, oxygen, air, ozone, water vapor, and/or $NO_2$. In some embodiments, the oxidizing ambient can be admixed with an inert gas such as, for example, He, Ar and/or Ne. In such an embodiment, the inert gas constituent from 2 volume % to 95 volume % of an oxidizing ambient containing admixture. The oxidation process can be performed at a temperature from 400° C. to 1300° C. The oxidation process may include a furnace anneal, a rapid thermal anneal or any other anneal that can convert a portion of the silicon fin 12 into a silicon germanium alloy fin 24. By using the above described oxidation process, the silicon germanium alloy fin 24 that is formed has a width that is equal to thickness of Si fin 12 less the width of the width of each silicon germanium alloy portion 14P.

In another embodiment of the present application (not shown), a thermal anneal, i.e., thermal mixing, can be used to form the silicon germanium alloy fin 24. During thermal annealing, Ge is diffused from the silicon germanium alloy portions 14P into the silicon fin 12 forming the silicon germanium alloy fin 24. When thermal annealing is performed, the thermal anneal can be carried out in an inert ambient such as, for example, He, Ar and/or Ne. The thermal anneal can be performed at a temperature from 800° C. to 1350° C. The thermal anneal may include a furnace anneal, a rapid thermal anneal or any other anneal that can convert the silicon fin 12 and the adjoining silicon germanium alloy layers 14P into a silicon germanium alloy fin 24. When thermal annealing is performed, the final thickness of the silicon germanium alloy fin 24 will be equal to the total width of the Si fin 12 plus the width of both silicon germanium alloy portions 14P.

In another embodiment, both the oxidation process (i.e., the condensation anneal) and the thermal mixing anneal can be performed sequentially or alternatingly. Either condensation or thermal mixing can be performed first.

Each silicon germanium alloy fin 24 can have a germanium content within the range mentioned above for the silicon germanium alloy layer 14P. In the present application, the germanium content with the silicon germanium alloy fin is vertically graded. That is, the wide upper portion 24U of each silicon germanium alloy fin 24 may have a greater germanium content than the narrower lower portion 24L of each silicon fin 24, with the lowest germanium content being located nearest the interface with the underlying Si fin portion 12P. In this embodiment of the present application, the wide upper portion 24U of the silicon germanium alloy fin 24 has a defect density that is less than the defect density within the narrower lower portion 24L.

Figure 9:
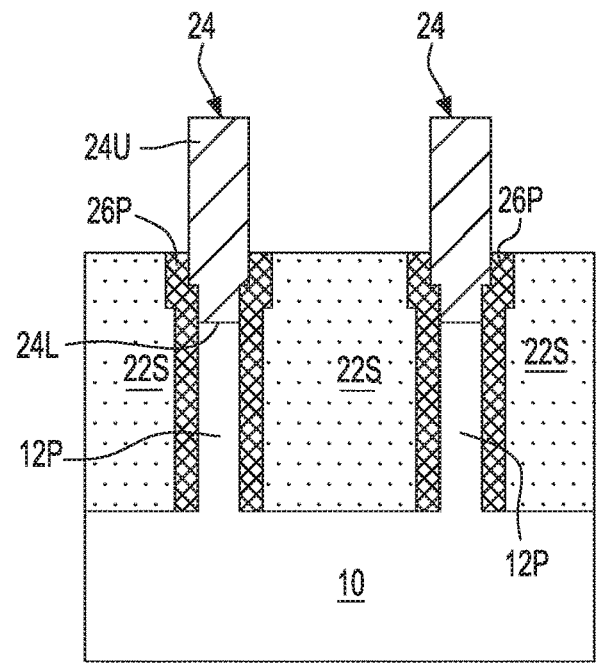
FIG. 9 is a cross sectional view of the exemplary semiconductor structure of FIG. 8 after exposing at least a portion of the wider upper portion of the silicon germanium alloy fin.

Referring now to FIG. 9, there is illustrated the exemplary semiconductor structure of FIG. 8 after exposing at least a portion of the wide upper portion 24U of the silicon germanium alloy fin 24. The exposing at least a portion of the wide upper portion 24U of the silicon germanium alloy fin 24 may include a recess etch that is selective in removing dielectric material selective to silicon germanium. In one example, the recess etch may include hydrofluoric acid as an etchant.

The recess etch removes a portion of the trench isolation dielectric material 22 and a portion of the silicon oxide layer 26L. The portions of the trench isolation dielectric material 22 that remain may be referred to herein as a trench isolation structure 22S, while the portions of the silicon oxide layer 26L that remain may be referred to herein as a silicon oxide liner portion 26P.

As is shown in FIG. 9, the exemplary semiconductor structure includes a silicon fin portion 12P extending upward from a remaining portion of a silicon substrate 10. A silicon germanium alloy fin 24 is located on the silicon fin portion 12P and comprises a wide upper portion 24U and a narrower lower portion 24L. The silicon germanium alloy fin 24 has a vertically graded germanium content in which the wide upper portion 24U of the silicon germanium alloy fin 24 has a greater germanium content than the narrower lower portion 24L of the silicon germanium alloy fin 24 and sidewall surfaces of the narrower lower portion 24L of the silicon germanium alloy fin 24 are vertically coincident with sidewall surfaces of the silicon fin portion 12P.

Figure 10:
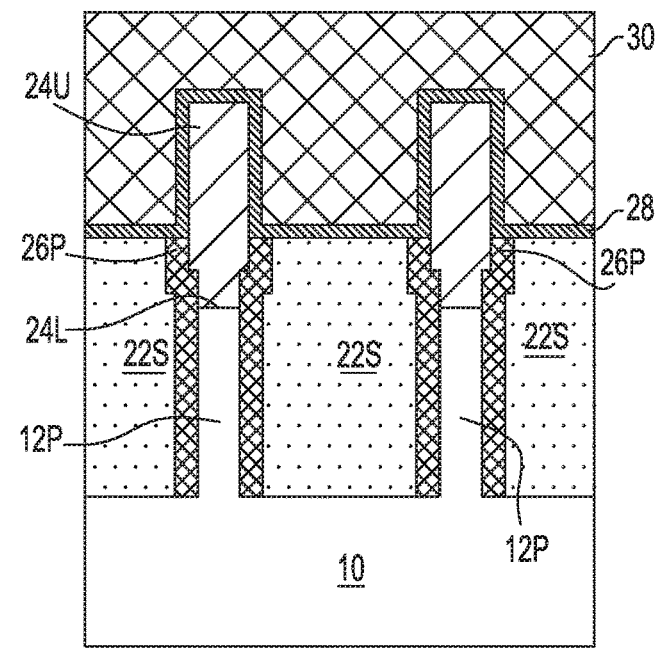
FIG. 10 is a cross sectional view of the exemplary semiconductor structure of FIG. 9 after formation of a gate structure.

Referring now to FIG. 10, there is illustrated the exemplary semiconductor structure of FIG. 9 after formation of a gate structure (28, 30). Although the present application describes and illustrates the formation of a single gate structure, a plurality of gate structures can be formed straddling different portions of each silicon germanium alloy fin 24. The term "straddling" denotes that the gate structure is formed across a silicon germanium alloy fin 24 such that a first portion of each gate structure is present on one side of the silicon germanium alloy fin 24, and a second portion of each gate structure is present on another side of the silicon germanium alloy fin 24. As shown in FIG. 10, a portion of the gate structure (28, 30) is also located on a topmost surface of a portion of each dielectric isolation structure 22S.

In some embodiments of the present application, and as shown, the gate structure (28, 30) is a functional gate structure. By "functional gate structure" it is meant a permanent gate structure used to control output current (i.e., flow of carriers in the channel) of a semiconducting device through electrical or magnetic fields. Each functional gate structure that is formed includes a gate material stack of, from bottom to top, a gate dielectric portion 28 and a gate conductor portion 30. In some embodiments, a gate cap portion (not shown) can be present atop the gate conductor portion 30.

The gate dielectric portion 28 comprises a gate dielectric material. The gate dielectric material that provides the gate dielectric portion 28 can be an oxide, nitride, and/or oxynitride. In one example, the gate dielectric material that provides the gate dielectric portion 28 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion 28.

The gate dielectric material used in providing the gate dielectric portion 28 can be formed by any deposition process including, for example, chemical vapor deposition (CVD), plasma enhanced chemical vapor deposition (PECVD), physical vapor deposition (PVD), sputtering, or atomic layer deposition. In some embodiments and when multiple functional gate structures are formed, each gate dielectric portion 28 comprises a same gate dielectric material. In other embodiments and when multiple functional gate structures are formed, some of the gate dielectric portions may comprise a first gate dielectric material, while other gate dielectric portions may comprise a second gate dielectric material that differs in composition from the first gate dielectric material. When a different gate dielectric material is used for the gate dielectric portions, block mask technology can be used. In one embodiment of the present application, the gate dielectric material used in providing the gate dielectric portion 28 can have a thickness in a range from 1 nm to 10 nm. Other thicknesses that are lesser than, or greater than, the aforementioned thickness range can also be employed for the gate dielectric material.

The gate conductor portion 30 comprises a gate conductor material. The gate conductor material used in providing the gate conductor portion 30 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion 30 may comprise an nFET gate metal. In other embodiments, the gate conductor portion 30 may comprise a pFET gate metal. In yet other embodiments and when multiple functional gate structures are formed, some of the gate conductor portions comprise an nFET gate metal, while others gate conductor portions comprise a pFET gate metal.

The gate conductor material used in providing the gate conductor portion 30 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing the gate conductor portion 30 has a thickness from 1 nm to 100 nm. Other thicknesses that are lesser than, or greater than, the aforementioned thickness range can also be employed for the gate conductor material used in providing the gate conductor portion 30.

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, the gate structure is a sacrificial gate structure. By sacrificial gate structure" it is meant a material or material stack that serves as a placeholder for a subsequently formed functional gate structure. In such a process, the functional gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion 28. The sacrificial gate material portion includes one of the gate conductor materials mentioned above for gate conductor portion 30. The sacrificial gate cap portion includes one of the gate cap material mentioned above for gate cap portions. The sacrificial gate structures can be formed by deposition of the various material layers and then patterning the resultant sacrificial material sack by utilizing, for example, lithography and etching.

After forming the gate structure (functional or sacrificial gate structure) source/drain regions (not) can be formed utilizing an epitaxial growth process from exposed portions of the silicon germanium alloy fin 24 that are not protected by the gate structure; the source/drain regions would by located with a plane that runs into and out of the drawing illustrated in FIG. 10. The source/drain regions comprise any semiconductor material including, for example, Si, Ge or silicon germanium alloys. The semiconductor material that provides the source/drain regions is doped with an n-type dopant or a p-type dopant as are well known those skilled in the art. The doping may be achieved during the epitaxial growth of the semiconductor material that provides the source/drain regions or after epitaxial growth of an intrinsic semiconductor material by utilizing ion implantation or gas phase doping.

In some embodiments, and prior to formation of the source/drain regions, a gate spacer (also not shown) can be formed on exposed sidewalls of the gate structure. The gate spacer can be formed by deposition of a gate spacer material, such as, for example, a dielectric oxide, and then etching the deposited gate spacer material by utilizing a spacer etch.

Figure 11:
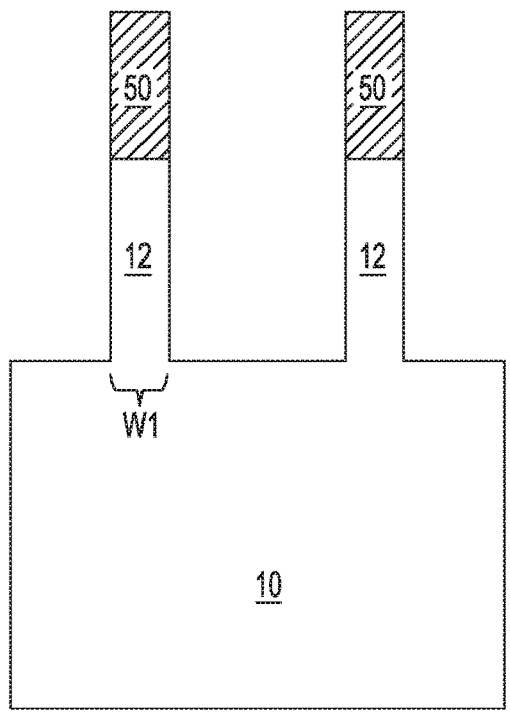
FIG. 11 is a cross sectional view of an exemplary semiconductor structure including a plurality of silicon fins of a first width that are capped with a hard mask cap and extending upwards from a surface of a remaining portion of a silicon substrate in accordance with a second embodiment of the present application.

Referring now to FIG. 11, there is illustrated an exemplary semiconductor structure including a plurality of silicon fins 12 of a first width, w1, that are capped with a hard mask cap 50 and extending upwards from a surface of a remaining portion of a silicon substrate 10 in accordance with a second embodiment of the present application.

In this embodiment of the present application, each silicon fin 12 has a height from 10 nm to 200 nm and first width, w1, from 4 nm to 30 nm. Other heights and widths that are lesser than, or greater than the ranges mentioned herein can also be used in the present application. Each silicon fin 12 is spaced apart from its nearest neighboring silicon fin 12 by a pitch of from 20 nm to 100 nm. Also, each silicon fin 12 is oriented parallel to each other. Furthermore, no material interface exists between each silicon fin 12 that is formed and the remaining portion of the silicon substrate 10.

The exemplary semiconductor structure shown in FIG. 11 can be formed by first providing a blanket layer of a hard mask material on a surface of a silicon substrate. The blanket layer of hard mask material is a contiguous layer that covers the entirety of the topmost semiconductor material layer 16L. The blanket layer of hard mask material that can be employed in the present application may include a semiconductor oxide, a semiconductor nitride and/or a semiconductor oxynitride. In one embodiment, the hard mask material that can be used in the present application can be comprised of silicon dioxide. In another embodiment, the hard mask material that can be used in the present application can be comprised of silicon nitride. In yet another embodiment, the hard mask material that can be used in the present application can include a hard mask stack of, in any order, silicon dioxide and silicon nitride.

In some embodiments, the hard mask material that can be used in the present application can be formed by a deposition process such as, for example, chemical vapor deposition (CVD) or plasma enhanced chemical vapor deposition (PECVD). In other embodiments, the hard mask material that can be used in the present application can be formed by a thermal process such as, for example, thermal oxidation and/or thermal nitridation. In yet other embodiments, the hard mask material that can be used in the present application can be formed by a combination of a deposition process and a thermal process. The thickness of the hard mask material that can be used in the present application can range from 2 nm to 10 nm, with a thickness from 3 nm to 6 nm being more typical.

After providing the blanket layer of hard mask material, the material stack of the silicon substrate and blanket layer of hard mask material is patterned utilizing one of the patterning processes mentioned above in providing the exemplary semiconductor structure shown in FIG. 1. That is, SIT or lithography and etching can be used to form the exemplary semiconductor structure shown in FIG. 11. Each hard mask cap 50 includes a remaining portion of the blanket layer of hard mask material. Also, each hard mask cap 50 that is formed has a bottommost surface that forms a material interface with a topmost surface of each silicon fin 12, and the sidewall surfaces of each hard mask cap 50 are vertically coincident to sidewall surfaces of a corresponding underlying silicon fin 12.

Figure 12:
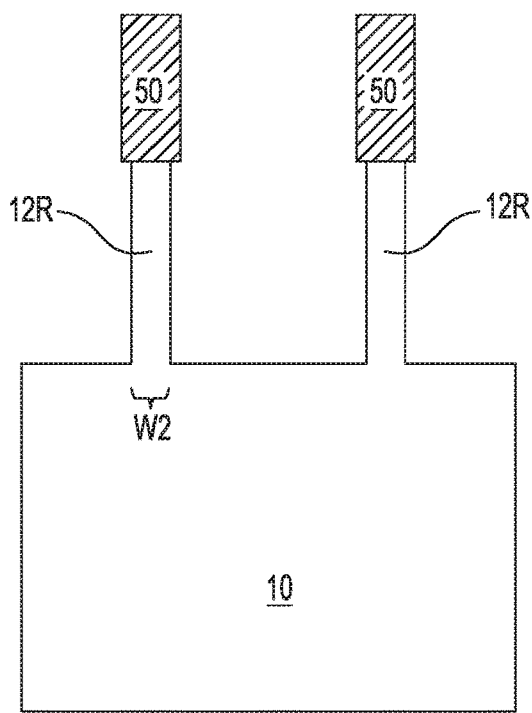
FIG. 12 is a cross sectional view of the exemplary semiconductor structure of FIG. 11 after thinning each silicon fin to a second width that is less than the first width.

Referring now to FIG. 12, there is illustrated the exemplary semiconductor structure of FIG. 11 after thinning each silicon fin 12 to a second width, w2, that is less than the first width, w1. The silicon fin having the second width, w2, can be referred to herein as a reduced thickness silicon fin 12R. In one embodiment of the present application, the reduced thickness silicon fin 12R can be formed by oxidation followed by an oxide removal etch. In another embodiment of the present application, the reduced thickness silicon fin 12R can be formed utilizing a chemical downstream etch. In either process, the etch does not affect the hard mask cap 50;

some thinning of the remaining portion of the silicon substrate 10 may occur during this step of the present application.

Figure 13:
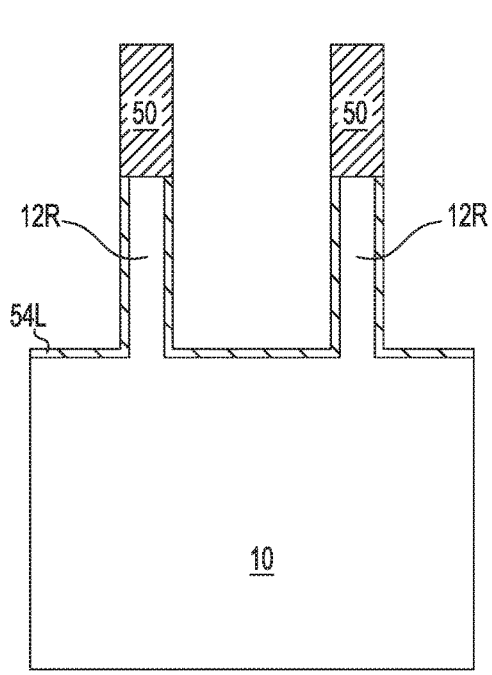
FIG. 13 is a cross sectional view of the exemplary semiconductor structure of FIG. 12 after forming a silicon germanium alloy layer on exposed surfaces of each silicon fin of the second width.

Referring now FIG. 13, there is illustrated the exemplary semiconductor structure of FIG. 12 after forming a silicon germanium alloy layer 14L on exposed surfaces of each silicon fin of the second width (i.e., the reduced thickness silicon fin 12R). The silicon germanium alloy layer 54L employed in this embodiment of the present application can be formed by epitaxy as previously described in providing the silicon germanium alloy layer 14L to the exemplary semiconductor structure shown in FIG. 2 of the present application. The silicon germanium alloy layer 54L of this embodiment of the present application can have a composition as described above for silicon germanium alloy layer 14L.

Figure 14:
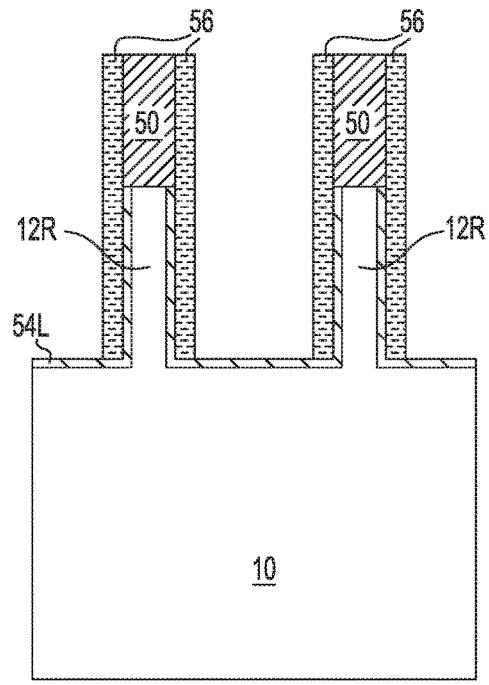
FIG. 14 is a cross sectional view of the exemplary semiconductor structure of FIG. 13 after forming a sacrificial spacer on exposed outer sidewall surfaces of each silicon germanium alloy layer and sidewall surfaces of each hard mask cap.

Referring now to FIG. 14, there is illustrated the exemplary semiconductor structure of FIG. 13 after forming a sacrificial spacer 56 on exposed outer sidewall surfaces of each silicon germanium alloy layer 54L and sidewall surfaces of each hard mask cap 50. Each sacrificial spacer 56 may include the same or a different material as that of the hard mask cap 50. In one embodiment, each sacrificial spacer 56 comprises a same material (e.g., silicon nitride) as each hard mask cap 50. Each sacrificial spacer 56 can be formed as described above in forming sacrificial spacer 20. That is, each sacrificial spacer 56 can be formed by depositing a sacrificial material, and then etching the sacrificial material to provide sacrificial spacer 56.

Figure 15:
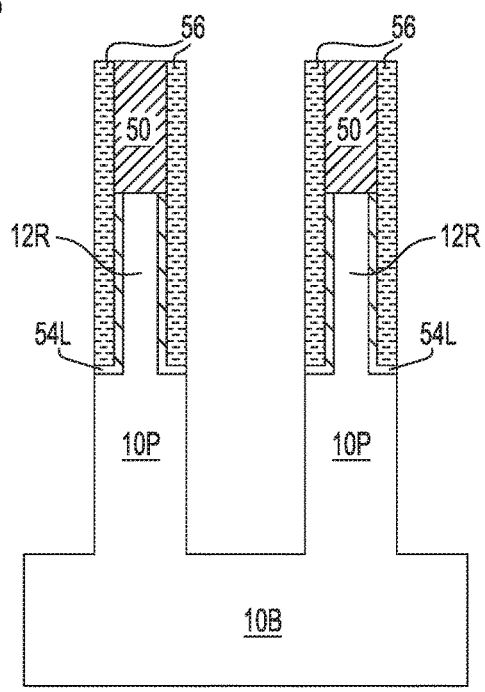
FIG. 15 is a cross sectional view of the exemplary semiconductor structure of FIG. 14 after recessing portions of the semiconductor substrate utilizing each sacrificial spacer and each hard mask cap as an etch mask.

Referring now to FIG. 15, there is illustrated the exemplary semiconductor structure of FIG. 14 after recessing remaining portions of the silicon substrate 10 utilizing each sacrificial spacer 56 and each hard mask cap 50 as an etch mask. The recessing provides a silicon pedestal portion 10P located between each silicon fin 12 and a reduced thickness remaining portion of silicon substrate (the reduced thickness remaining portion of silicon substrate is referred to herein as a silicon base substrate 10B).

Each silicon pedestal portion 10P has a third width that is greater than the second width of each silicon fin 12. In the present application, the third width is equal to the second width plus the thickness of each sacrificial spacer 56 that is located on sidewalls of each silicon fin 12. Each silicon pedestal portion 10P has outer sidewalls that are vertically coincident to the outermost sidewalls of each sacrificial spacer 56.

The recess that provides the exemplary semiconductor structure shown in FIG. 15 comprises an anisotropic etch that is selective in removing silicon as compared to the materials that provide the sacrificial spacers 56 and each hard mask cap 50. In one example, the recess etch is performed utilizing a reactive ion etch (RIE) silicon etch process.

Figure 16:
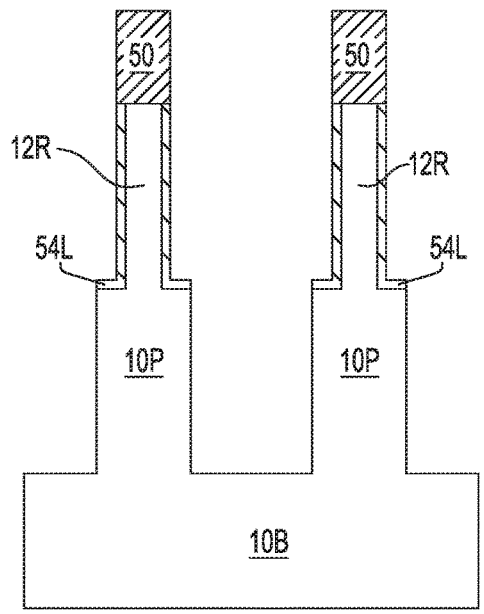
FIG. 16 is a cross sectional view of the exemplary semiconductor structure of FIG. 15 after removing each sacrificial spacer.

Referring now to FIG. 16, there is illustrated the exemplary semiconductor structure of FIG. 15 after removing each sacrificial spacer 56. Each sacrificial spacer 56 can be removed utilizing an etching process that is selective in removing the sacrificial spacer material that provides each sacrificial spacer 56. During the removal of each sacrificial spacer 56, an upper portion of each hard mask cap 50 may be removed.

Figure 17:
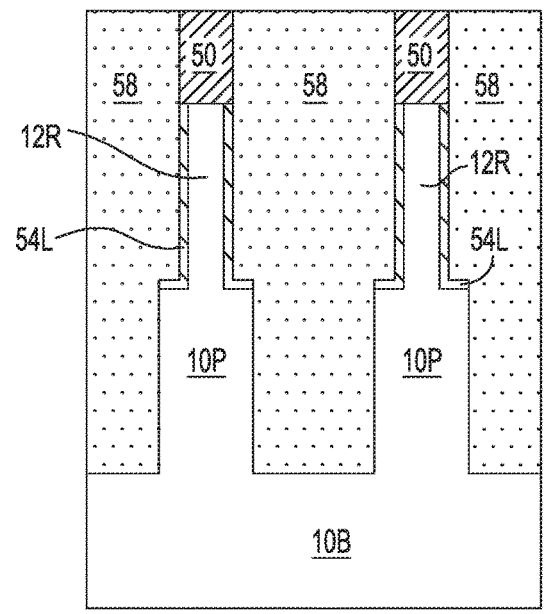
FIG. 17 is a cross sectional view of the exemplary semiconductor structure of FIG. 16 after forming a trench isolation dielectric material having a topmost surface that is coplanar with a topmost surface of each hard mask cap.

Referring now to FIG. 17, there is illustrated the exemplary semiconductor structure of FIG. 16 after forming a trench isolation dielectric material 58 having a topmost surface that is coplanar with a topmost surface of each hard mask cap 50. Trench isolation dielectric material 58 includes a trench dielectric material as mentioned above for trench isolation dielectric material 22. Trench isolation dielectric material 58 can be formed utilizing the processing steps mentioned above in forming trench isolation dielectric material 22.

Figure 18:
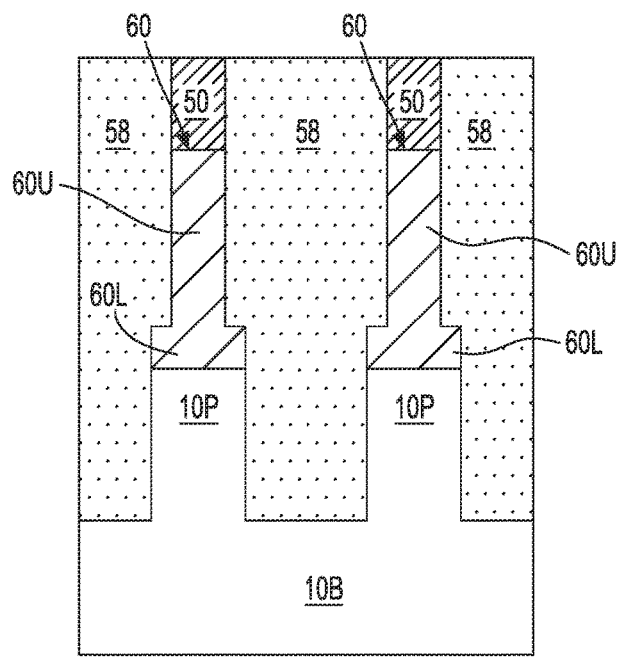
FIG. 18 is a cross sectional view of the exemplary semiconductor structure of FIG. 17 after converting the silicon fin and each silicon germanium alloy layer into a silicon germanium alloy fin having a narrow upper portion and a wider lower portion.

Referring now to FIG. 18, there is illustrated the exemplary semiconductor structure of FIG. 17 after converting the silicon fin 12 and each silicon germanium alloy layer 54L into a silicon germanium alloy fin 60 having a narrow upper portion 60U and a wider lower portion 60L. The wider lower portion 60L of the silicon germanium alloy fin 60 is formed within a topmost surface of the Si pedestal portion 10P. The silicon germanium alloy fin 60 can be formed by utilizing an oxidation process, as described above, or alternatively, a thermal anneal, as also described above, can be employed. In the illustrated embodiment, a thermal anneal is shown by way of an example.

Each silicon germanium alloy fin 60 can have a germanium content within the range mentioned above for the silicon germanium alloy layer 54L. In the present application, the germanium content of each silicon germanium alloy fin 60 is vertically graded. That is, the narrow upper portion 60U of each silicon germanium alloy fin 60 may have a greater germanium content than the wider lower portion 60L of each silicon fin 60, with the lowest germanium content being located nearest the interface with the underlying Si pedestal portion 10P. In this embodiment of the present application, the narrow upper portion 60U of the silicon germanium alloy fin 60 has a defect density that is less than the defect density within the wider lower portion 60L.

Figure 19:
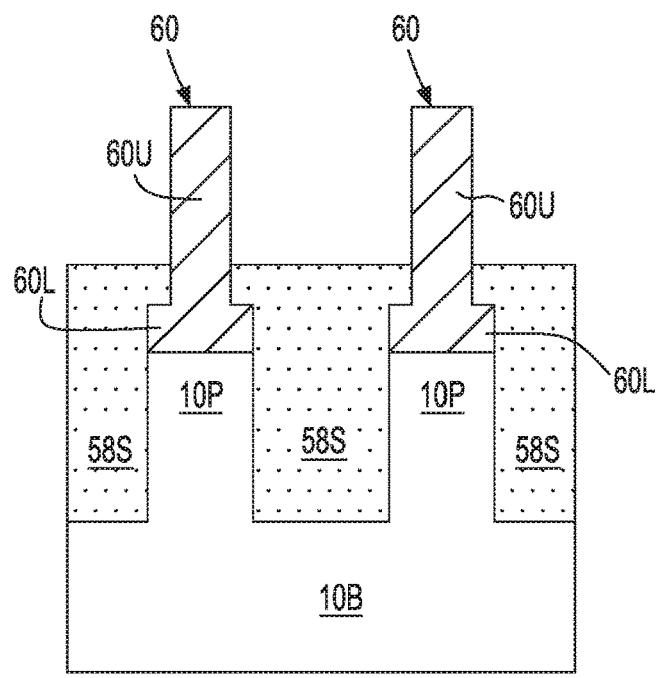
FIG. 19 is a cross sectional view of the exemplary semiconductor structure of FIG. 18 after exposing at least a portion of the narrow upper portion of the silicon germanium alloy fin.

Referring now to FIG. 19, there is illustrated the exemplary semiconductor structure of FIG. 18 after exposing at least a portion of the narrow upper portion 60U of the silicon germanium alloy fin 60. The exposing at least a portion of the wide upper portion 60U of the silicon germanium alloy fin 60 may include a recess etch that is selective in removing dielectric material selective to silicon germanium. In one example, the recess etch may include hydrofluoric acid as an etchant. The recess etch removes a portion of the trench isolation dielectric material 58 to provide a trench isolation structure 58S.

As is shown in FIG. 19, a semiconductor structure is provided that includes a silicon pedestal portion 10P extending upward from a silicon base substrate 10B. A silicon germanium alloy fin 60 is located on the silicon pedestal portion 10P and comprises a narrow upper portion 60I and a wider lower portion 60L. The silicon germanium alloy fin 60 has a vertically graded germanium content in which the narrow upper portion 60U of the silicon germanium alloy fin 60 has a greater germanium content than the wider lower portion 60L of the silicon germanium alloy fin 60. The sidewall surfaces of the wider lower portion 60L of the silicon germanium alloy fin 60 are vertically coincident with sidewall surfaces of the silicon pedestal portion 10P.

Figure 20:
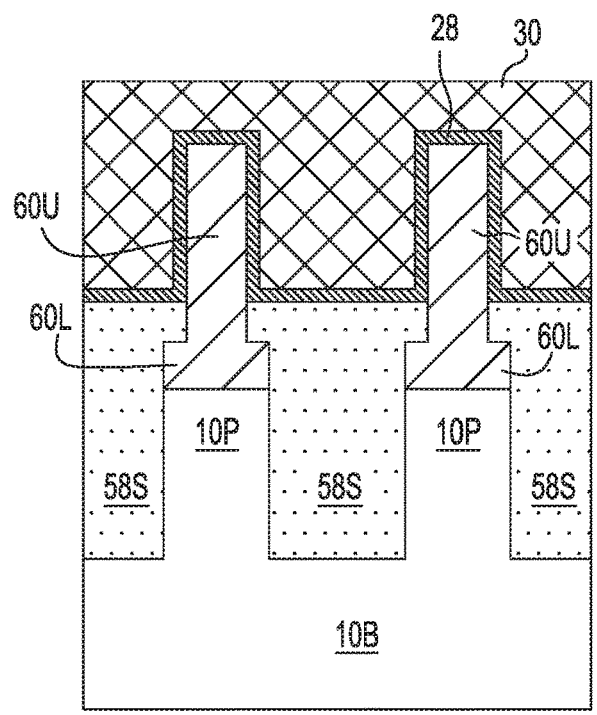
FIG. 20 is a cross sectional view of the exemplary semiconductor structure of FIG. 19 after formation of a gate structure.

Referring now to FIG. 20, there is illustrated the exemplary semiconductor structure of FIG. 19 after formation of a gate structure. In one embodiment, gate structure may include a functional gate structure (28, 30) that includes a gate dielectric portion 28 and a gate conductor portion 30 as were described above. In yet another embodiment, the gate structure is a sacrificial gate structure (as defined above) which can be replaced by a functional gate structure (28, 30) after formation of the source/drain regions.

Figure 21:
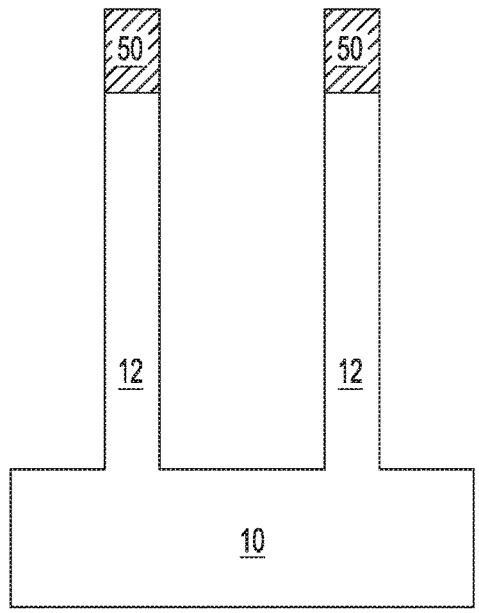
FIG. 21 is a cross sectional view of an exemplary semiconductor structure including a plurality of silicon fins that are capped with a hard mask cap and extending upwards from a surface of a remaining portion of a silicon substrate in accordance with a third embodiment of the present application.

Referring now to FIG. 21, there is illustrated an exemplary semiconductor structure including a plurality of silicon fins 12 (of the first width) that are capped with a hard mask cap 50 and extending upwards from a surface of a remaining portion of a silicon substrate 10 in accordance with a third embodiment of the present application. The structure shown in FIG. 21 can be formed as described above for forming the exemplary semiconductor structure of FIG. 12. The only difference between the exemplary semiconductor structures shown in FIG. 12 and that shown in FIG. 21 is the height of each silicon fin 12. In the present embodiment, each silicon fin 12 has a height that is greater than the height of each silicon fin 12 shown in FIG. 12.

Figure 22:
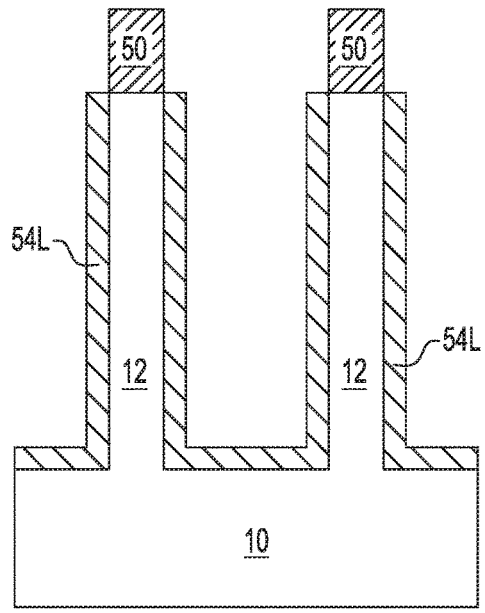
FIG. 22 is a cross sectional view of the exemplary semiconductor structure of FIG. 21 after forming a silicon germanium alloy layer on exposed surfaces of each silicon fin.

Referring now to FIG. 22, there is illustrated the exemplary semiconductor structure of FIG. 21 after forming a silicon germanium alloy layer 54L on exposed surfaces of each silicon fin 12. The silicon germanium alloy layer 54L employed in this embodiment of the present application can be formed by epitaxy as previously described in providing the silicon germanium alloy layer 14L to the exemplary semiconductor structure shown in FIG. 2 of the present application. The silicon germanium alloy layer 54L of this embodiment of the present application can have a composition as described above for silicon germanium alloy layer 14L.

Figure 23:
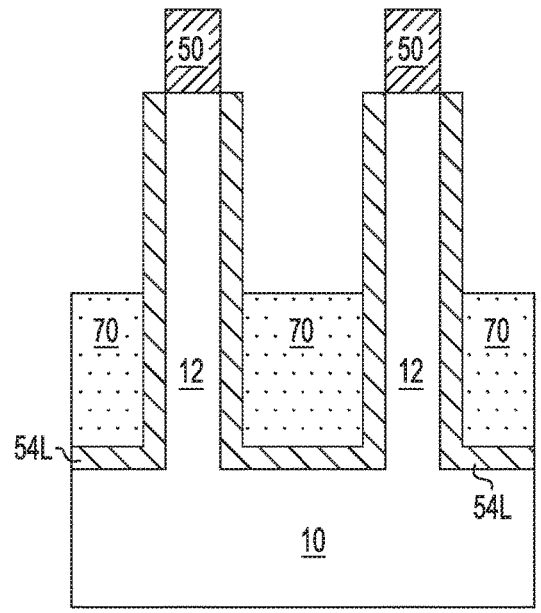
FIG. 23 is a cross sectional view of the exemplary semiconductor structure of FIG. 22 after forming a sacrificial dielectric structure within each gap that is located between each silicon fin of the plurality of silicon fins.

Referring now to FIG. 23, there is illustrated the exemplary semiconductor structure of FIG. 22 after forming sacrificial dielectric structure 70 within each gap that is located between each silicon fin of the plurality of silicon fins 12. As is shown, the sacrificial dielectric structure 70 has a height that is less than the height of each silicon fin 12. The sacrificial dielectric structure 70 can be formed by first depositing an oxide material that can fill the gaps (i.e., a gap filling oxide material) between each silicon fin 12. In one embodiment, the sacrificial dielectric structure 70 comprises an oxide that can be derived from TEOS (tetraethylorthosilicate). In another embodiment, the sacrificial dielectric structure 70 may comprise a flowable oxide such as, for example, silicon oxide containing hydrogen and carbon. The deposition of the oxide material (i.e., gap filling oxide material) may include for example, CVD or PECVD. In some embodiments and in which the gap filling oxide material overfills each gap, a recess etch may follow the deposition of the gap filling oxide material. In some embodiments, no recess etch follows the deposition of the gap filling oxide. Instead, the deposition step only partially fills each gap with the gap filling oxide material.

Figures 24, 25:
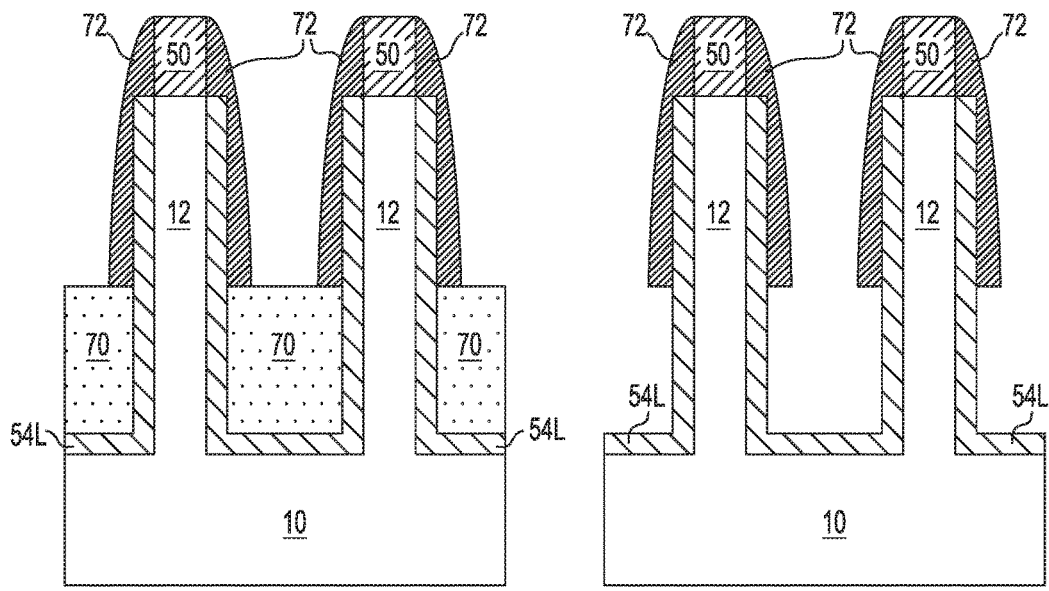
FIG. 24 is a cross sectional view of the exemplary semiconductor structure of FIG. 23 after forming a sacrificial spacer on an exposed outer sidewall surface of the silicon germanium alloy layer that is located on each sidewall surface of each silicon fin, sidewall surfaces of each hard mask cap and on a portion of each sacrificial dielectric structure.
FIG. 25 is a cross sectional view of the exemplary semiconductor structure of FIG. 24 after removing each sacrificial dielectric structure.

Referring now to FIG. 24, there is illustrated the exemplary semiconductor structure of FIG. 23 after forming a sacrificial spacer 72 on an exposed outer sidewall surface of the silicon germanium alloy layer 54L that is located on each sidewall surface of each silicon fin 12, sidewall surfaces of each hard mask cap 50 and on a portion of each sacrificial dielectric structure 70. Sacrificial spacers 72 comprise one of the sacrificial materials mentioned above for sacrificial spacers 20 and they can be formed by deposition and etching as also described above for forming sacrificial spacers 20. Each sacrificial spacer 72 has a bottommost surface, i.e., base, that is present on topmost surface of the sacrificial dielectric structure 70 and a topmost surface that is coplanar with a topmost surface of each hard mask cap 50. Each sacrificial spacer 72 may comprise a same material as, or a different material than, each hard mask cap 50.

Referring now to FIG. 25, there is illustrated the exemplary semiconductor structure of FIG. 24 after removing each sacrificial dielectric structure 70. Each sacrificial dielectric structure 70 is removed utilizing an etching process that selectively removes the gap filling oxide material relative to that of the material that provides the sacrificial spacers 72 and the silicon germanium alloy layer 54L. In one embodiment, HF can be used to selectively remove each sacrificial dielectric structure 70. As illustrated, the sacrificial spacers 72 and the hard mask caps 50 remain and protect portions of the silicon germanium alloy layer 54L and an upper portion of each silicon fin 12.

Figure 26:
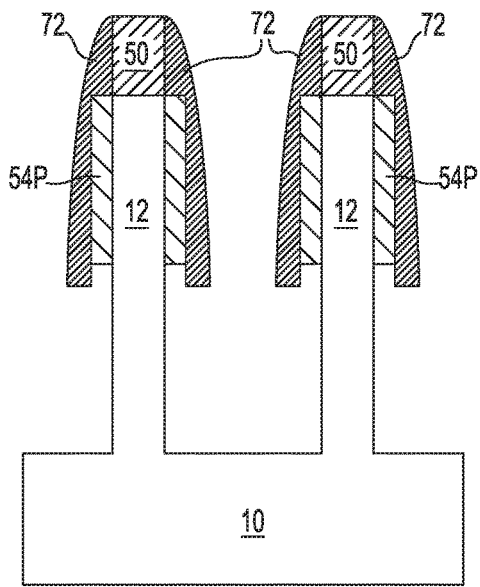
FIG. 26 is a cross sectional view of the exemplary semiconductor structure of FIG. 25 after removing exposed portions of the silicon germanium alloy layer not protected by one of the sacrificial spacers to provide a silicon germanium alloy portion on each sidewall surface of each silicon fin.

Referring now to FIG. 26, there is illustrated the exemplary semiconductor structure of FIG. 25 after removing exposed portions of the silicon germanium alloy layer 54L not protected by one of the sacrificial spacers 72 to provide a silicon germanium alloy portion 54P on each sidewall surface of each silicon fin 12. The removal of the exposed portions of the silicon germanium alloy layer 54L comprises an isotropic etch that is selective in removing a silicon germanium alloy relative to the materials of the sacrificial spacer 72 and each hard mask cap 50 and silicon. In one example, a $H_2O_2$ etch may be used to remove the exposed portions of the of the silicon germanium alloy layer 54L. This step exposes each sacrificial spacer 72, a lower portion of each silicon fin 12 and a topmost surface of the remaining portion of silicon substrate 10. As is shown in the drawings, each remaining silicon germanium alloy portion 54P has a bottommost surface that is vertically offset and located above a bottommost surface of each sacrificial spacer 72

Figure 27:
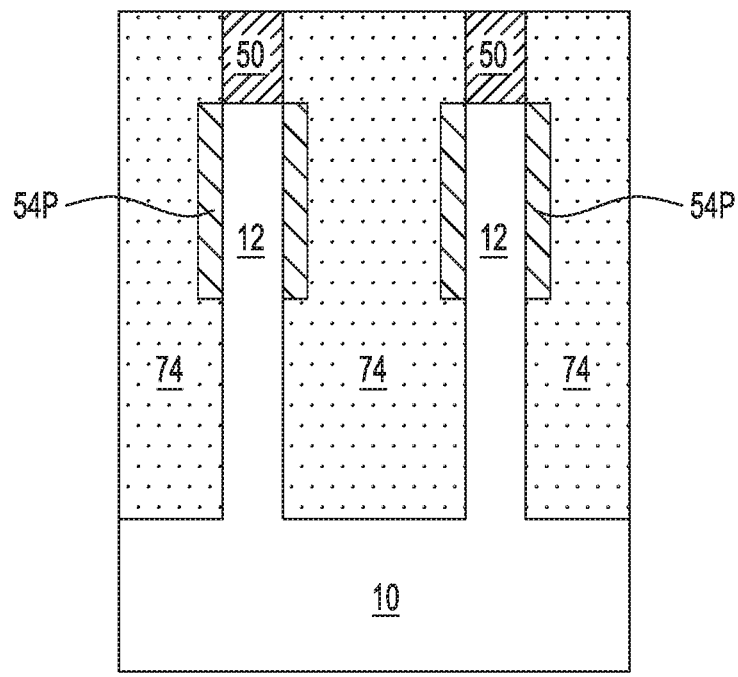
FIG. 27 is a cross sectional view of the exemplary semiconductor structure of FIG. 26 after removing each sacrificial spacer and forming a trench isolation dielectric material having a topmost surface that is coplanar with a topmost surface of each hard mask cap.

Referring now to FIG. 27, there is illustrated the exemplary semiconductor structure of FIG. 26 after removing each sacrificial spacer 72 and forming a trench isolation dielectric material 74 having a topmost surface that is coplanar with a topmost surface of each hard mask cap 50. Each sacrificial spacer 72 can be removed utilizing an etching process that selectively removes the sacrificial material that provides each sacrificial spacer relative to the silicon germanium alloy portion 54P, silicon fin 12, hard mask cap 50 and the remaining portion of the silicon substrate 10. In one embodiment of the present application, and when the sacrificial spacers 72 comprise silicon nitride, phosphoric acid can be used as an etchant.

The trench isolation dielectric material 74 comprises any trench dielectric material including, for example, silicon dioxide. The trench isolation dielectric material 74 can be formed utilizing any deposition process including for example, chemical vapor deposition or plasma enhanced chemical vapor deposition. After depositing the trench dielectric material, a planarization process such as, for example, chemical mechanical planarization (CMP) and/or grinding, may be used. As is shown, the trench isolation dielectric material 74 has a topmost surface that is coplanar with a topmost surface of each hard mask cap 50. As is also shown, the trench isolation dielectric material 74 completely fills the gaps that are located between each silicon fin 12.

Figure 28:
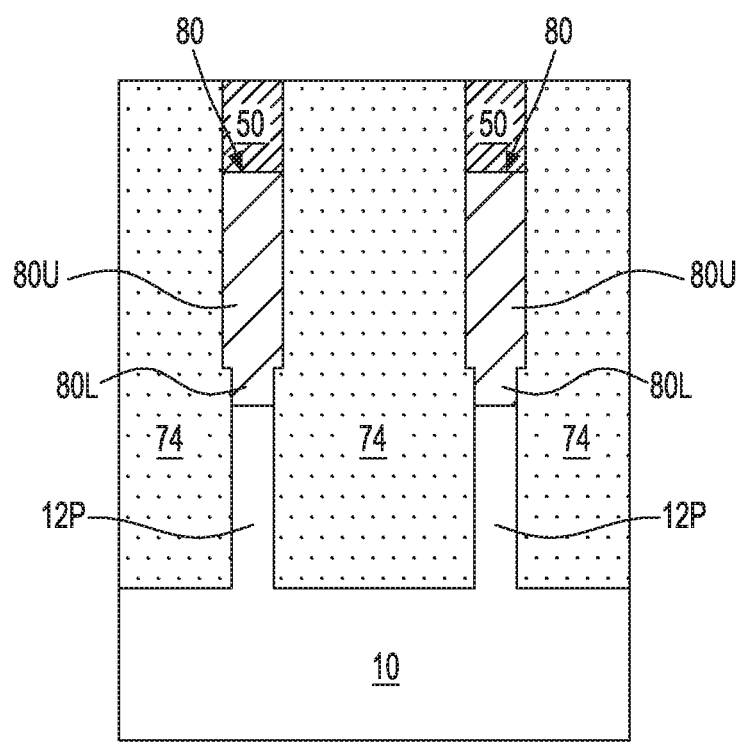
FIG. 28 is a cross sectional view of the exemplary semiconductor structure of FIG. 27 after converting a portion of the silicon fin that is located laterally adjacent each silicon germanium alloy portion into a silicon germanium alloy fin having a wide upper portion and a narrower lower portion.

Referring now to FIG. 28, there is illustrated the exemplary semiconductor structure of FIG. 27 converting a portion of the silicon fin 12 that is located laterally adjacent each silicon germanium alloy portion 54P into a silicon germanium alloy fin 80 having a wide upper portion 80U and a narrower lower portion 80L. Each silicon germanium alloy fin 80 sits atop a remaining portion of silicon fin 12 (hereinafter silicon fin portion 12P). The silicon fin portion 12P serves as a fin base for the silicon germanium alloy fin 80. Each silicon germanium alloy portion 54P is typically consumed during this process of the present application. In some embodiments (not depicted), it is possible that some portion of each silicon germanium alloy portion 44P may reaming within the structure. The silicon germanium alloy fin 80 can be formed by utilizing an oxidation process, as described above, or alternatively, a thermal anneal, as also described above, can be employed. In the illustrated embodiment, an oxidation process is shown by way of an example. In this illustrated embodiment, the silicon oxide layer is not shown since it comprises the same dielectric material as trench isolation dielectric material 74.

Each silicon germanium alloy fin 80 can have a germanium content within the range mentioned above for the silicon germanium alloy layer 54P. In the present application, the germanium content of each silicon germanium alloy fin 80 is vertically graded. That is, the wide upper portion 80U of each silicon germanium alloy fin 80 may have a greater germanium content than the narrower lower portion 80L of each silicon germanium alloy fin 80, with the lowest germanium content being located nearest the interface with the underlying Si fin portion 12P. In this embodiment of the present application, the wide upper portion 80U of the silicon germanium alloy fin 80 has a defect density that is less than the defect density within the narrower lower portion 80L. In this embodiment, defects may be present at the top corners of each silicon germanium alloy fin 80. Those defects are limited at the silicon germanium alloy fin 80 top portion due to the self-limiting (111) planes of the Si fin. Those defects can be removed either by etching or oxidation followed by oxide etch.

Figure 29:
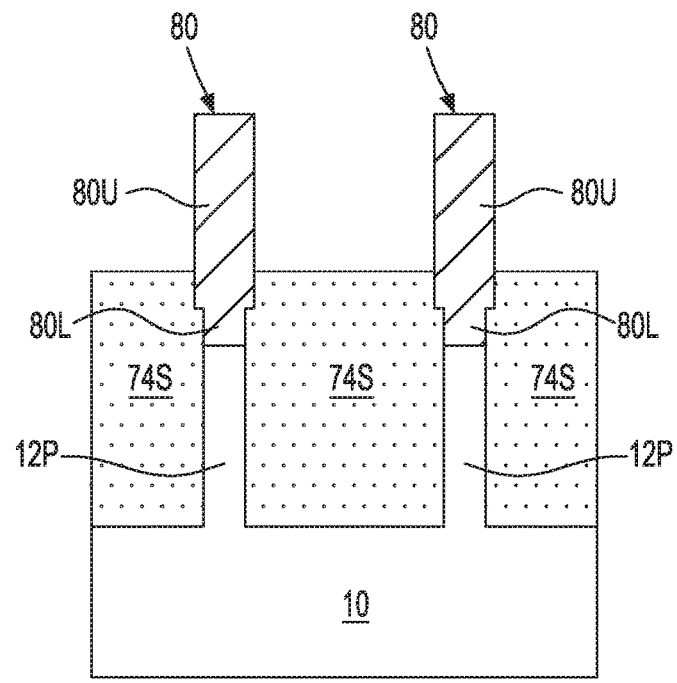
FIG. 29 is a cross sectional view of the exemplary semiconductor structure of FIG. 28 after exposing at least a portion of the wider upper portion of the silicon germanium alloy fin.

Referring now to FIG. 29, there is illustrated the exemplary semiconductor structure of FIG. 28 after exposing at least a portion of the wider upper portion 80U of each silicon germanium alloy fin 80. The exposing at least a portion of the wide upper portion 80U of the silicon germanium alloy fin 80 may include a recess etch that is selective in removing dielectric material selective to silicon germanium. In one example, the recess etch may include hydrofluoric acid as an etchant.

The recess etch removes a portion of the trench isolation dielectric material 74. The portions of the trench isolation dielectric material 74 that remain may be referred to herein as a trench isolation structure 74S.

As is shown in FIG. 29, the exemplary semiconductor structure includes a silicon fin portion 12P extending upward from a remaining portion of a silicon substrate 10. A silicon germanium alloy fin 80 is located on the silicon fin portion 12P and comprises a wide upper portion 80U and a narrower lower portion 80L. The silicon germanium alloy fin 80 has a vertically graded germanium content in which the wide upper portion 80U of the silicon germanium alloy fin 80 has a greater germanium content than the narrower lower portion 80L of the silicon germanium alloy fin 80 and sidewall surfaces of the narrower lower portion 80L of the silicon germanium alloy fin 80 are vertically coincident with sidewall surfaces of the silicon fin portion 12P.

Figure 30:
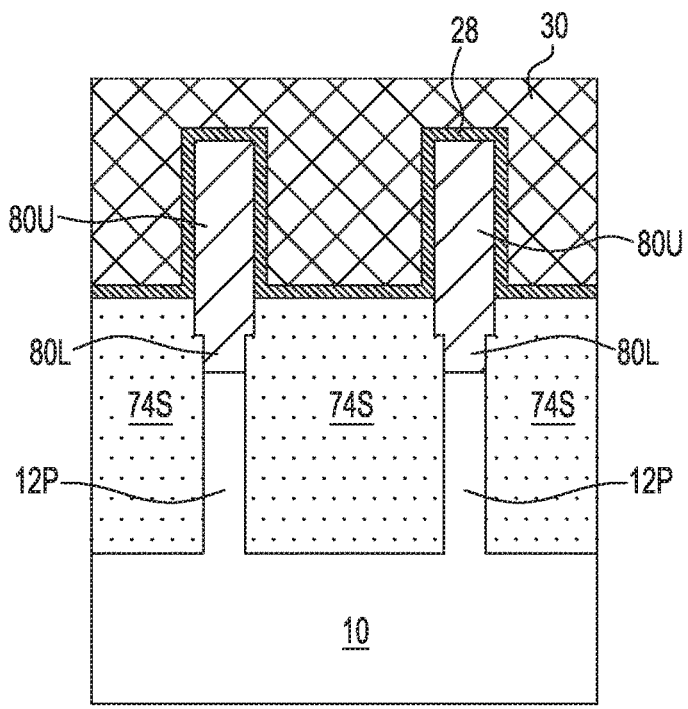
FIG. 30 is a cross sectional view of the exemplary semiconductor structure of FIG. 29 after formation of a gate structure.

Referring now to FIG. 30, there is illustrated the exemplary semiconductor structure of FIG. 29 after formation of a gate structure. In one embodiment, gate structure may include a functional gate structure (28, 30) that includes a gate dielectric portion 28 and a gate conductor portion 30 as were described above. In yet another embodiment, the gate structure is a sacrificial gate structure (as defined above) which can be replaced by a functional gate structure (28, 30) after formation of the source/drain regions.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
    forming a silicon germanium alloy portion on an upper portion of each sidewall surface of a silicon fin and having a topmost surface that is vertically off-set and located beneath a topmost surface of said silicon fin, said silicon fin extending upward from a remaining portion of a silicon substrate, and wherein a sacrificial spacer is present on an outermost sidewall of said silicon germanium alloy portion;
    removing said sacrificial spacer from said silicon germanium alloy portion;
    providing, after said removing of said sacrificial spacer, a trench isolation dielectric material on physically exposed surfaces of said remaining portion of said silicon substrate and on physically exposed sidewall surfaces of each silicon germanium alloy portion and said silicon fin; and
    converting a portion of the silicon fin that is located laterally adjacent each silicon germanium alloy portion into a silicon germanium alloy fin, wherein said silicon germanium alloy fin comprises a wide upper portion and a narrower lower portion, wherein said silicon germanium alloy fin has a vertically graded germanium content in which said wide upper portion of said silicon germanium alloy fin has a greater germanium content than said narrower lower portion of said silicon germanium alloy fin and wherein sidewall surfaces of said narrower lower portion of said silicon germanium alloy fin are vertically aligned with sidewall surfaces of said silicon fin portion.

2. The method of claim 1, wherein said converting comprises an oxidation process.

3. The method of claim 2, wherein said oxidation process is performed at a temperature from 400° C. to 1300° C. and in an oxidizing ambient.

4. The method of claim 2, wherein said oxidation process forms a silicon oxide layer on both said wide upper portion and said narrower lower portion of said silicon germanium alloy fin.

5. The method of claim 4, further comprising removing a portion of said silicon oxide layer and portion of said trench dielectric material to physically expose a portion of said wide upper portion of said silicon germanium alloy fin.

6. The method of claim 5, further comprising forming a functional gate structure straddling said physically exposed portion of said wide upper portion of said silicon germanium alloy fin.

7. The method of claim 6, wherein a portion of said functional gate structure extends onto a topmost surface of a remaining portion of said silicon oxide layer and a remaining portion of said trench dielectric material.

8. The method of claim 7, wherein said remaining portion of said silicon oxide layer has a topmost surface that is coplanar with a remaining portion of said trench dielectric material.

9. The method of claim 1, wherein said converting comprises a thermal anneal in an inert ambient.

10. The method of claim 9, wherein said thermal anneal is performed at a temperature from 800° C. to 1300° C.

11. The method of claim 9, further comprising recessing said trench isolation dielectric material to physically expose a portion of said wide upper portion of the silicon germanium alloy fin.

12. The method of claim 11, further comprising forming a functional gate structure straddling said physically exposed portion of said wide upper portion of said silicon germanium alloy fin.

13. The method of claim 12, wherein a portion of said functional gate structure extends onto a topmost surface of a remaining portion of said trench dielectric material.

14. The method of claim 1, wherein said wide upper portion of said silicon germanium alloy fin has a defect density that is less than a defect density of said narrower lower portion of said silicon germanium alloy fin.

15. The method of claim 1, wherein said silicon germanium alloy portion and said silicon germanium alloy fin have a germanium content of from 20 atomic percent to 80 atomic percent.

16. The method of claim 1, wherein said silicon germanium alloy portion has a bottommost surface that is vertically off-set and located above a bottommost surface of said sacrificial spacer.

* * * * *